US006867648B2

(12) United States Patent
Kim et al.

(10) Patent No.: US 6,867,648 B2
(45) Date of Patent: Mar. 15, 2005

(54) LINEARIZATION APPARATUS CAPABLE OF ADJUSTING PEAK-TO-AVERAGE POWER RATIO

(75) Inventors: Bumman Kim, Kyungsangbuk-do (KR); Youngoo Yang, Kyungsangbuk-do (KR); Young Yun Woo, Kyungsangbuk-do (KR)

(73) Assignee: Postech Foundation, Pohang-shi (KR)

( * ) Notice: Subject to any disclaimer, the term of this patent is extended or adjusted under 35 U.S.C. 154(b) by 0 days.

(21) Appl. No.: 10/449,595

(22) Filed: Jun. 2, 2003

(65) Prior Publication Data

US 2004/0017256 A1 Jan. 29, 2004

(30) Foreign Application Priority Data

Jul. 25, 2002 (KR) .......................................... 2002-43821

(51) Int. Cl.[7] ................................................ H03F 1/00
(52) U.S. Cl. ...................................... 330/151; 330/149
(58) Field of Search ................................. 330/151, 149; 375/297; 455/63

(56) References Cited

U.S. PATENT DOCUMENTS

| 6,078,216 A | * | 6/2000 | Proctor, Jr. | 330/151 |
| 6,392,483 B2 | * | 5/2002 | Suzuki et al. | 330/151 |
| 6,417,731 B1 | * | 7/2002 | Funada et al. | 330/149 |

* cited by examiner

Primary Examiner—Henry Choe
(74) Attorney, Agent, or Firm—McGuireWoods LLP (57) ABSTRACT

A linearized amplification apparatus includes a means for dividing an input signal into a main channel signal and a subsidiary channel signal, a PAR (Peak-to-Average power Ratio) adjustment block for reducing a PAR of the main channel signal to generate a sub-main signal having a reduced PAR compared to the PAR of the main channel signal, an error extraction block for extracting an error signal from the subsidiary channel signal and amplifying the error signal, the amplified error signal corresponding to distortion components in the sub-main signal, and a means for coupling the sub-main signal with the amplified error signal to generate an output signal having an increased PAR compared to the PAR of the sub-main signal.

4 Claims, 7 Drawing Sheets

LINEARIZATION APPARATUS CAPABLE OF ADJUSTING PEAK-TO-AVERAGE POWER RATIO

FIELD OF THE INVENTION

The present invention relates to a linearized amplification apparatus; and, more particularly, to an apparatus for linearly amplifying a signal of a very high peak-to-average power ratio.

BACKGROUND OF THE INVENTION

Modern communications systems employ a wide spectrum of modulation techniques, such as CDMA (Code Division Multiple Access), WCDMA (Wideband CDMA), OFDM (Orthogonal Frequency Division Multiplexing), and the like. In order to avoid intermodulation production and spectral regrowth, it is essential that RF power amplifier circuits used in such systems be highly linear. However, modulated signals used in such modulation techniques have complicated signal statistics and high PAR (Peak-to-Average power Ratio). The signal statistics inherently affect the nonlinear behavior of high power amplifiers, and circuit configurations for linearization of the high power amplifiers should be adapted to the signal statistics including PAR.

Therefore, to achieve a required performance efficiently, an appropriate linearization strategy for each modulation scheme should be applied. Generally, feed-forward and various kinds of predistortion circuits have been widely used to linearize high power amplifiers.

In a predistortion scheme, a controlled nonlinear distortion is applied to an amplifier input signal. A predistortion circuitry is designed to give nonlinear amplitude and phase characteristics complementary to a distortion generated by the amplifier itself, so that ideally, the distortion is canceled out in the amplifier output over the entire signal bandwidth. The predistortion scheme however suffers from some drawbacks of poor linearity and amplification efficiency.

The feed-forward (FF) compensation scheme has been generally considered to be a best linearization scheme and thus an FF amplification apparatus has been most widely used to obtain better linearity in a high power amplifier.

Figure 1:
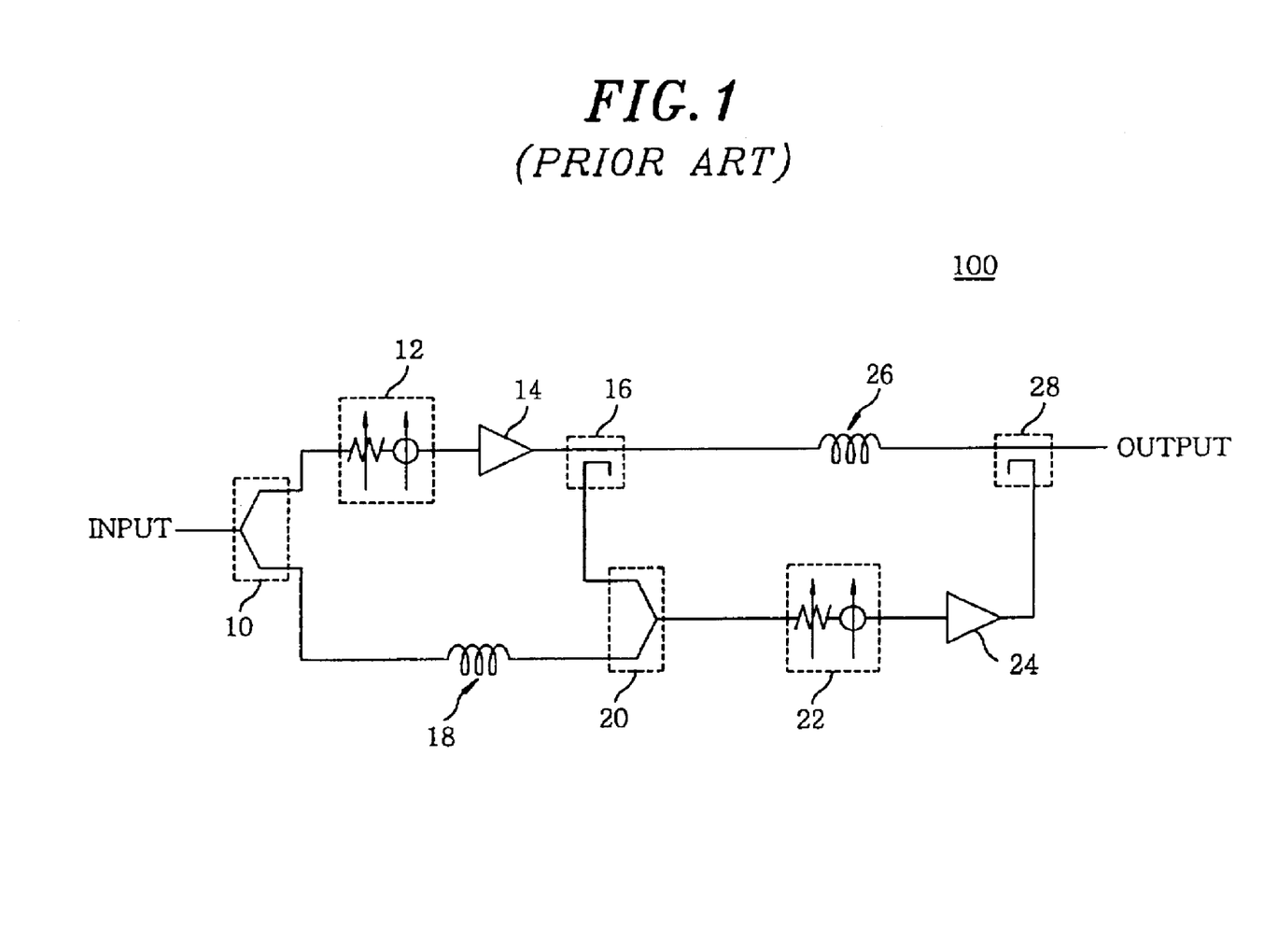
FIG. 1 shows a block diagram of a conventional amplification apparatus employing a feed-forward scheme.

FIG. 1 shows a block diagram of a conventional FF amplification apparatus 100.

An input signal of the FF amplification apparatus 100 is divided into a main path signal and a subsidiary path signal at a power splitter 10. The main path signal is provided to a main amplifier 14 via a first vector modulator 12, and the subsidiary path signal is provided to a combiner 20 via a first delay line 18. The main path signal is then amplified by the main amplifier 14, and transferred to a first directional coupler 16, wherein the amplified main path signal includes therein distortion components generated in the amplification process. The amplified main path signal is separated into a primary signal and an auxiliary signal at the first directional coupler 16.

The primary signal is delayed and forwarded to a second directional coupler 28 via a second delay line 26, whereas the auxiliary signal is sent to the combiner 20. The auxiliary signal is combined with the delayed subsidiary path signal at the combiner 20 to extract therefrom an error signal corresponding to distortion components generated in the main amplifier 14.

The error signal is provided to an error amplifier 24 via a second vector modulator 22, and then transferred to the second directional coupler 28. The delayed primary signal is coupled with the amplified error signal at the second directional coupler 28, and thus amplified distortion free signal is outputted therefrom.

However, the FF amplification apparatus also has many drawbacks, such as complexity, efficiency, size, and so on, which result in cost problems. Also, linearity specifications of the 3rd generation wireless systems especially ACLR (Adjacent Channel Leakage Ratio) and out-of-band spectrum emission, become more stringent than those of the 1st or 2nd generation systems. Thus, a linearization technique, which provides a better performance than FF and predistortion, is highly desired.

SUMMARY OF THE INVENTION

It is, therefore, an object of the present invention to provide an amplification apparatus capable of linearly amplifying a signal of a high PAR (Peak-to-Average power Ratio).

In accordance with the present invention, there is provided a linearized amplification apparatus, including: means for dividing an input signal into a main channel signal and a subsidiary channel signal; a PAR (Peak-to-Average power Ratio) adjustment block for reducing a PAR of the main channel signal to generate a sub-main signal having a reduced PAR compared to the PAR of the main channel signal; an error extraction block for extracting an error signal from the subsidiary channel signal and amplifying the error signal, the amplified error signal corresponding to distortion components in the sub-main signal; and means for coupling the sub-main signal with the amplified error signal to generate an output signal having an increased PAR compared to the PAR of the sub-main signal.

BRIEF DESCRIPTION OF THE DRAWINGS

The above and other objects and features of the present invention will become apparent from the following description of the preferred embodiment given in conjunction with the accompanying drawings, in which.

DETAILED DESCRIPTION OF THE PREFERRED EMBODIMENTS

Figure 2:
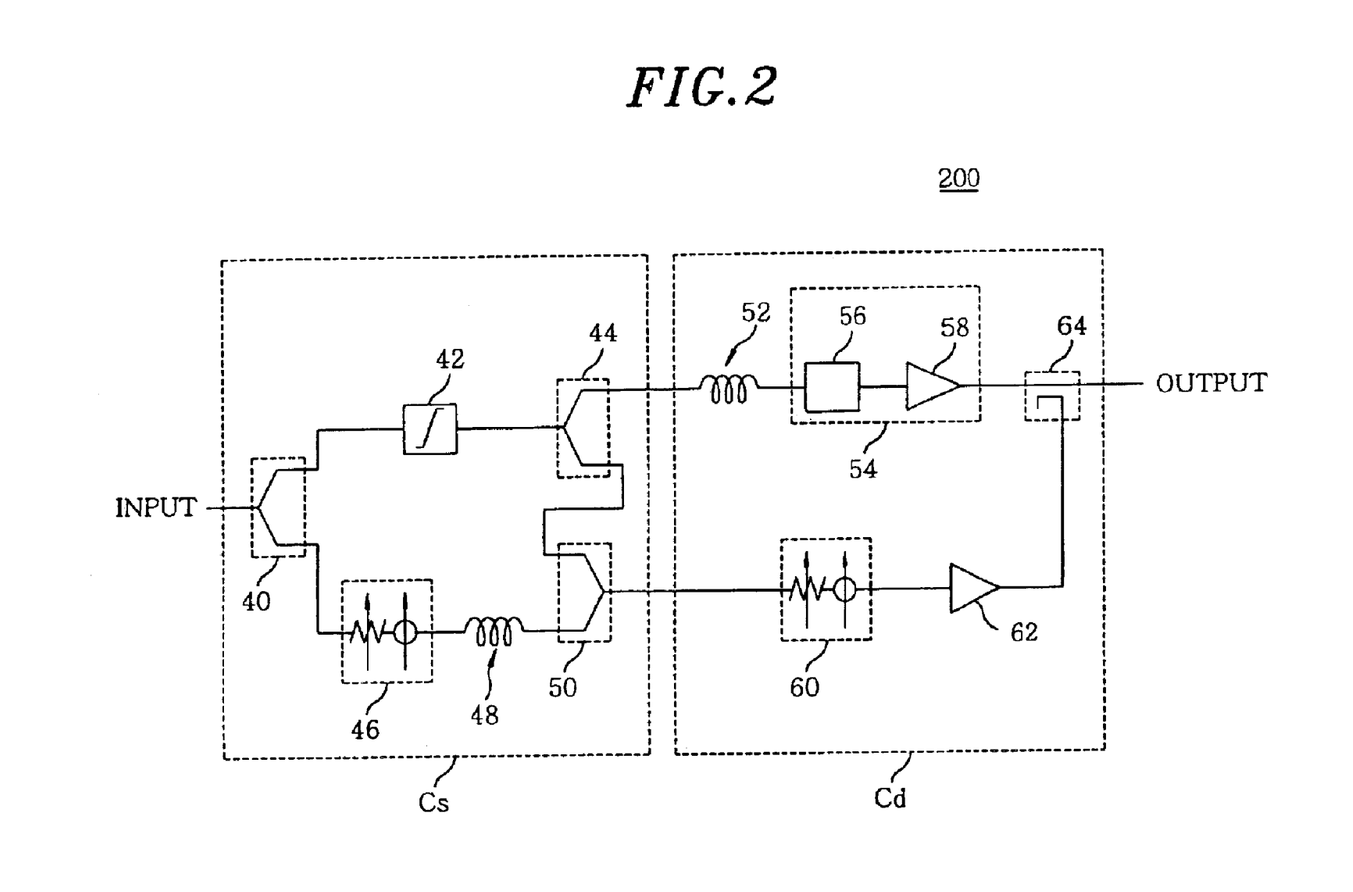
FIG. 2 describes a block diagram of an amplification apparatus employing a PRE (Peak-to-average power ratio Reduction and Expansion) scheme in accordance with the present invention.

FIG. 2 shows a block diagram of an amplification apparatus 200, which employs a PRE (Peak-to-average power ratio Reduction and Expansion) scheme in accordance with the present invention. The PRE amplification apparatus 200 includes a main signal cancellation block Cs and a distortion cancellation block Cd. The main signal cancellation block Cs has a first power splitter 40, a rate limiter 42, a second power splitter 44, a first vector modulator 46, a first delay line 48 and a combiner 50. The distortion cancellation block Cd has a second delay line 52, an amplification module 54, a second vector modulator 60, an error amplifier 62 and a directional coupler 64, wherein the amplification module 54 has a pre-distorter 56 and a power amplifier 58.

In particular, the first power splitter 40, the rate limiter 42, the second power splitter 44, the second delay line 52, the amplification module 54 and the directional coupler 64 form a PAR (Peak-to-Average power Ratio) adjustment line. In accordance with the present invention, the PAR of signals passing through the PAR adjustment line is adjusted along the PAR adjustment line. The changes in PAR will be described in detail hereinafter.

In the signal cancellation block Cs, an input signal (e.g., a modulated signal) is divided into a main channel signal and a subsidiary channel signal at the first power splitter 40. The main channel signal is provided to the rate limiter 42 and the subsidiary channel signal is transmitted to the first vector modulator 46.

The rate limiter 42 clips or limits the main channel signal to a predetermined range and delivers the clipped signal to the second power splitter 44. Accordingly, the output signal of the rate limiter 42 has a significantly reduced PAR compared to the input signal thereof (i.e., the main channel signal). The clipping process generates a high spectral regrowth, i.e., out-of-band spectrum emission.

The second power splitter 44 subdivides the clipped signal into a primary signal and a secondary signal. The primary signal is provided to the second delay line 52, whereas the secondary signal is subjected to the combiner 50.

The first vector modulator 46 vector-modulates the subsidiary channel signal, and thereafter transmits the vector-modulated subsidiary channel signal to the first delay line 48.

The first delay line 48 delays the vector-modulated subsidiary channel signal by a predetermined delay time and forwards it to the combiner 50.

The combiner 50 serves to subtract the delayed subsidiary channel signal from the secondary signal, to thereby extract an error signal which corresponds to distortion components incurred during the clipping of the main channel signal in the rate limiter 42 (i.e., the portions of the main channel signal located outside the predetermined range and thus discarded by the rate limiter 42).

In the distortion cancellation block Cd, the second delay line 52 delays the primary signal by a preset delay time, and then delivers the delayed primary signal to the amplification module 54.

Subsequently, the amplification module 54 performs a pre-distortion and an amplification on the delayed primary signal delivered from the second delay line 52. More specifically, the pre-distorter 56 introduces a pre-distortion into the delayed primary signal prior to amplification, ideally the pre-distortion having a same amplitude, but with an opposite sign, as an actual distortion to be produced by the power amplifier 58. The pre-distorted signal from the pre-distorter 56 is amplified by the power amplifier 58.

In accordance with the present invention, the PAR of the input signal of the pre-distorter 56 is reduced at the rate limiter 42. As a result, the pre-distorter 56 can deliver a better linearization. The power amplifier 58 also delivers and generates less spectral regrowth as the PAR is reduced at a same average output power. Therefore, the linearity of the amplification module 54 can be enhanced.

In the meantime, the error signal from the combiner 50 is vector-modulated by the second vector modulator 60 and the error amplifier 62 amplifies the vector-modulated error signal outputted from the second vector modulator 60. Then the amplified error signal is subjected to the directional coupler 64.

The directional coupler 64 couples an output signal of the amplification module 54 with that of the error amplifier 62, to thereby generate an output signal of the PRE amplification apparatus 200. The output signal is an amplified signal with an enhanced linearity. In other words, the characteristics, e.g., PAR and PSD (Power Spectral Density), of the output signal of the PRE amplification apparatus 200 are reconstructed to be nearly identical to those of the initial input signal thereof, wherein the PAR of the final output signal is expanded up to that of the input signal and the PSD of the regrowth components is significantly suppressed.

As described above, changes in PAR and PSD take place along the PAR adjustment line in the PRE amplification apparatus 200. Such changes will be described hereinafter.

FIGS. 3A, 4A, 5A and 6A provide CCDF (Complementary Cumulative probability Distribution Function) curves as a function of relative PAR of signals passing through the PAR adjustment line, wherein the x-axis represents a relative PAR level (dB) and the y-axis represents a CCDF (%). FIGS. 3B, 4B, 5B and 6B depict PSD's of the signals passing through the PAR adjustment line, wherein the x-axis represents a frequency and the y-axis represents a PSD level (dBm).

Figure 3A:
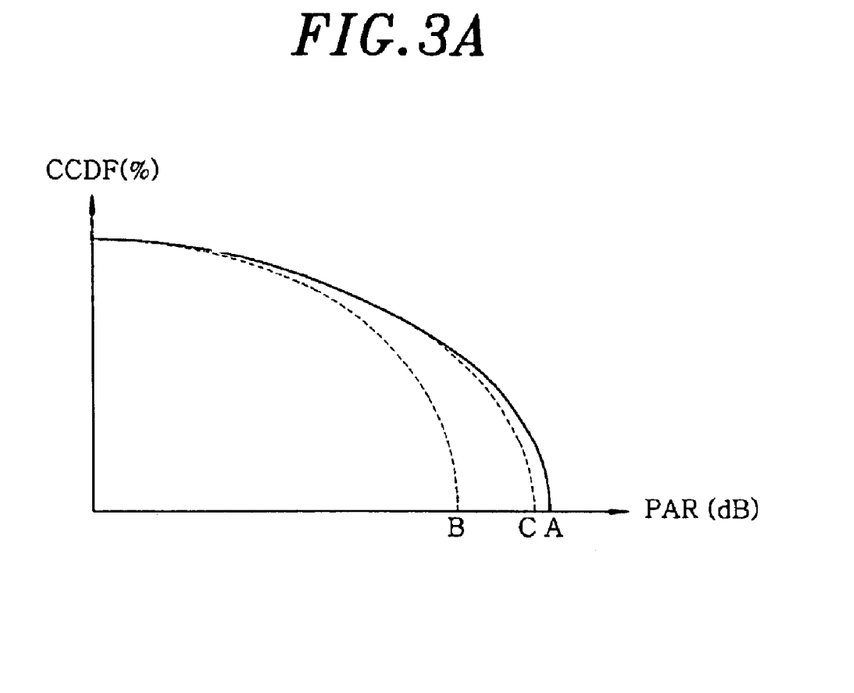
FIGS. 3A and 3B respectively illustrate CCDF (Complementary Cumulative probability Distribution Function) curves and a PSD (Power Spectral Density) of an input signal of a rate limiter in the PRE amplification apparatus of the present invention.
Figure 3B:
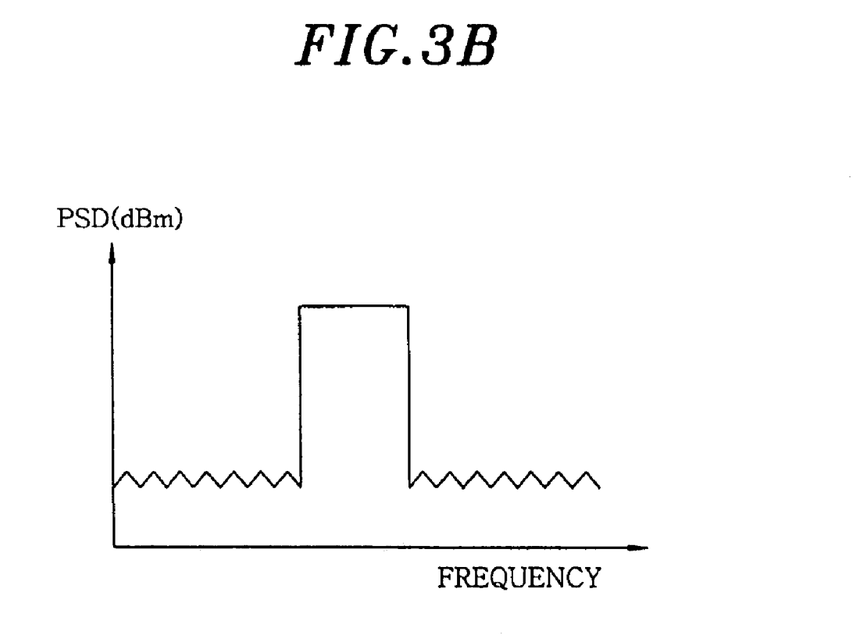

In FIG. 3A, a solid line curve A represents a CCDF of the input signal (i.e., main channel signal) of the rate limiter 42, curves B and C will be described later in detail. In FIG. 3B, there is shown a PSD of the main channel signal, which represents distortion-free signal.

Figure 4A:
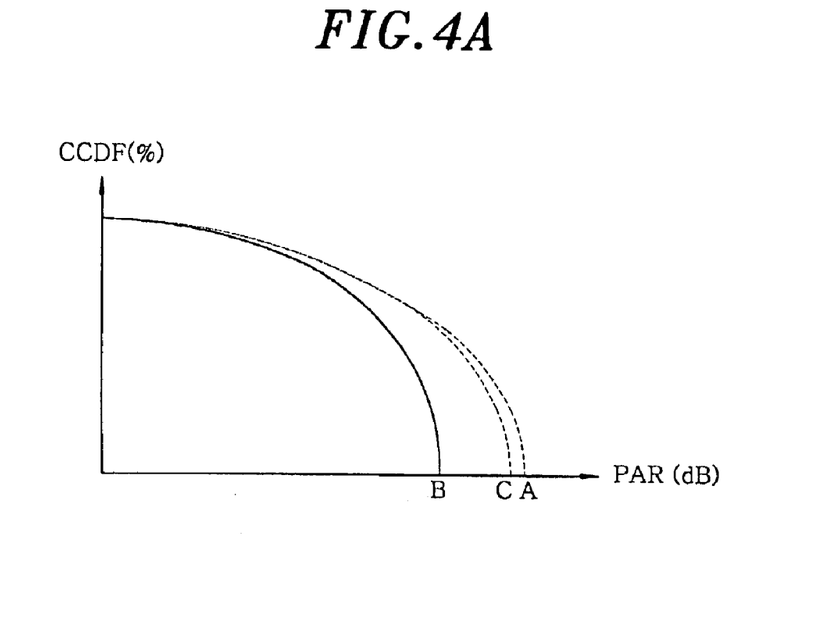
FIGS. 4A and 4B represent CCDF curves and a PSD of an output signal of the rate limiter in the PRE amplification apparatus, respectively.

Referring to FIG. 4A, a solid line curve B represents a CCDF of the output signal (i.e., clipped signal) of the rate limiter 42. Curve A represents a CCDF of the main channel signal as mentioned above. Because the peak power of the main channel signal has been clipped in the rate limiter 42, the PAR of the clipped signal is significantly reduced compared to the main channel signal as shown in the drawing.

Moreover, such power clipping process incurs a high spectral regrowth, i.e., out-of-band spectrum emission. As seen from FIG. 4B, PSD of the clipped signal contains spectral regrowth components additionally generated in the PSD of the main channel signal.

Figure 5A:
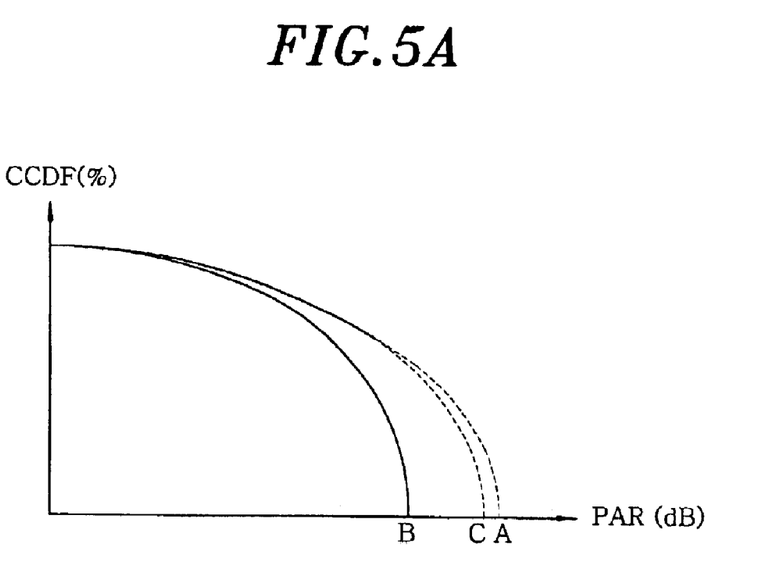
FIGS. 5A and 5B are CCDF curves and a PSD of an output signal of an amplification module in the PRE amplification apparatus, respectively.

Referring to FIG. 5A, curve B represents a CCDF of the output signal of the amplification module 54, which is virtually identical to curve B in FIG. 4A. Since the input signal of the amplification module 54 (i.e., the delayed primary signal) has a low enough PAR and thus the amplification module 54 does not fall into a saturation region, the amplification module 54 can almost linearly amplify the delayed primary signal. Therefore, the CCDF of the output signal of the amplification module 54 (curve B of FIG. 5A) can retain the characteristic CCDF of the clipped signal (curve B of FIG. 4A).

Figure 4B:
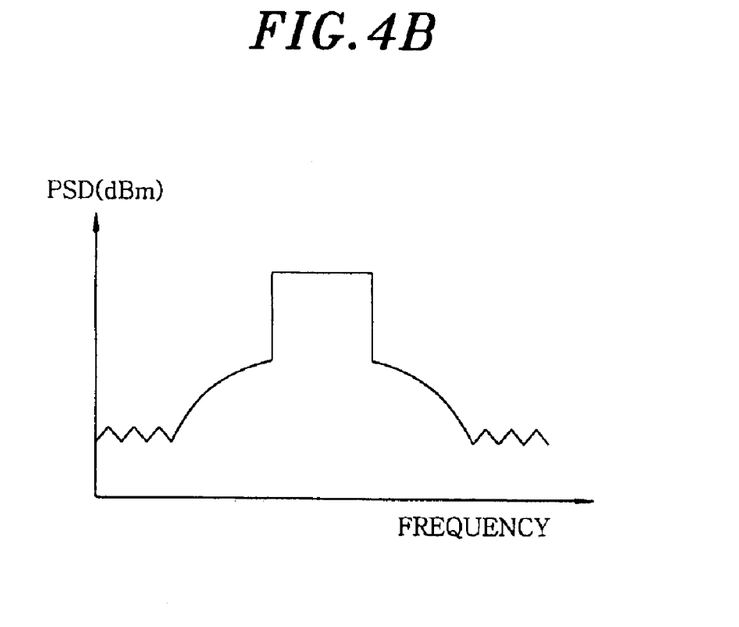
Figure 5B:
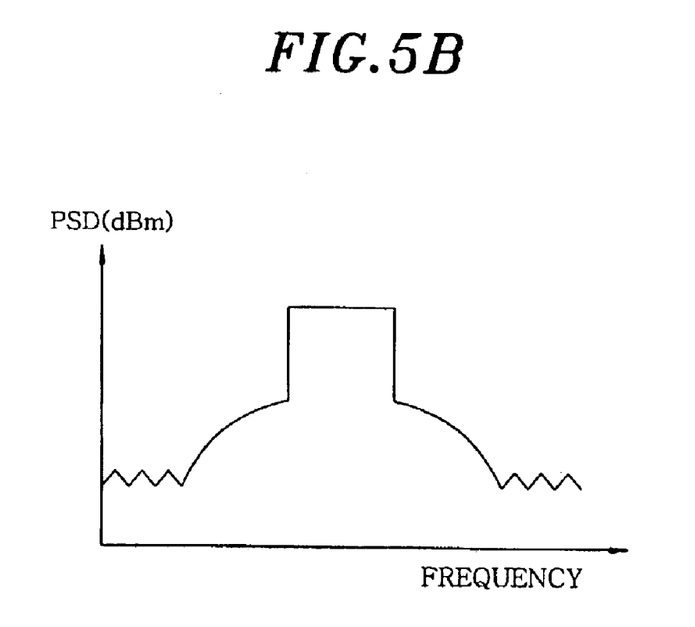

Similarly, the PSD of the output signal of the amplification module 54 shown in FIG. 5B could be a close replica of the CCDF of the clipped signal shown in FIG. 4B.

As described above, the power clipping process carried out at the rate limiter 42 to reduce the PAR incurs a high spectral regrowth, i.e., an out-of-band spectrum emission, which mixes distortion components into an input signal. In the PRE amplification apparatus 200, thus generated distortion components are extracted in the main signal cancellation block Cs, and subsequently are compensated in the distortion cancellation block Cd. As a result, the linearly amplified signal is obtained as the output signal of the PRE amplification apparatus 200. The characteristics of the output signal are described in FIGS. 6A and 6B.

Figure 6A:
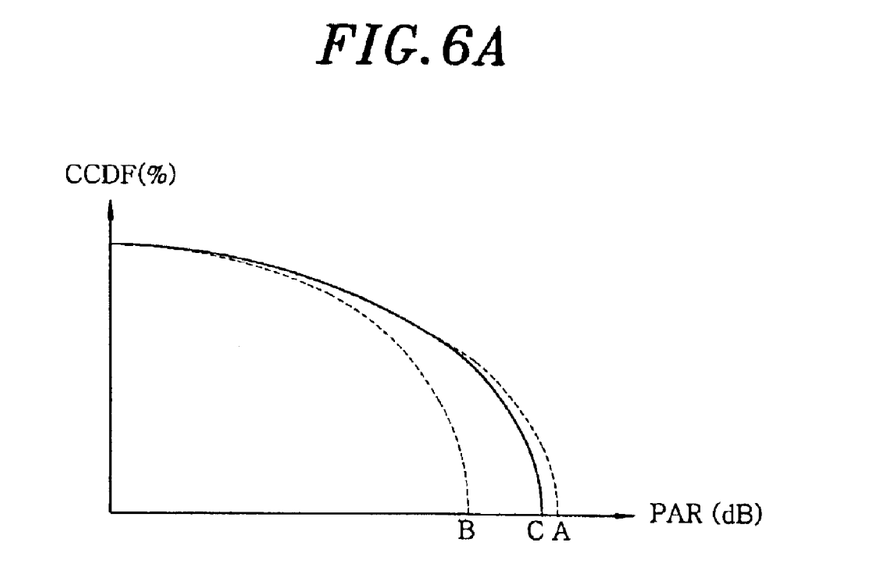
FIGS. 6A and 6B provide CCDF curves and a PSD of an output signal of the PRE amplification apparatus, respectively.

FIG. 6A provides a CCDF curve of the output signal of the directional coupler 64 (i.e., the output signal of the PRE amplification apparatus 200). The CCDF of the output signal is represented by a solid line curve C, which becomes almost identical to that of the main channel signal. In practice, this shows that the PAR of the input signal of the PRE amplification apparatus 200, which was significantly reduced by the rate limiter 42, is nearly restored in the output signal of the PRE amplification apparatus 200.

Figure 6B:
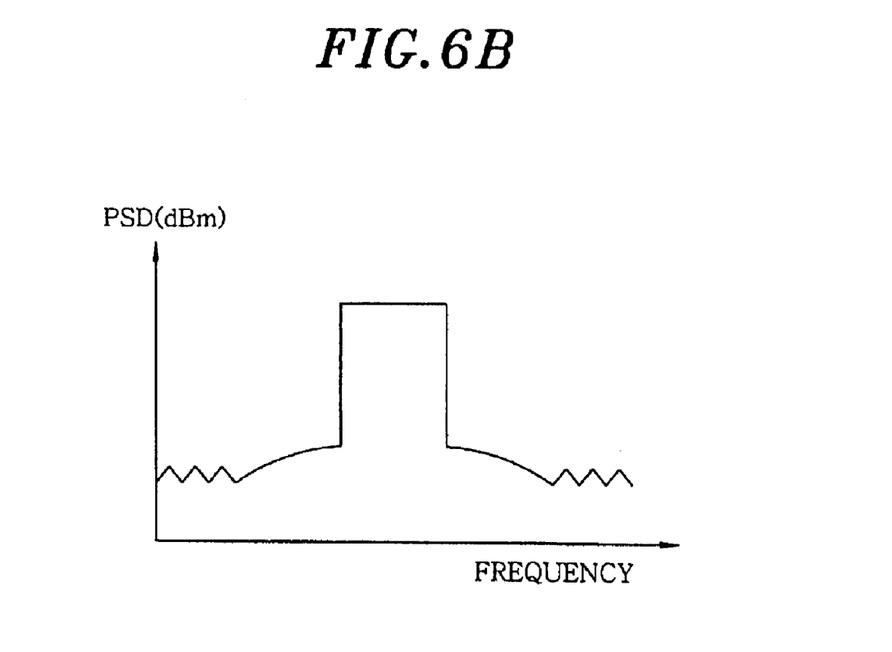

Also, as shown in FIG. 6B, the PSD of the regrowth components in the final output signal is considerably decreased compared to that of the clipped signal shown in FIG. 4B and the output signal of the amplification module 54 shown in FIG. 5B. In other words, the PSD of the final output signal is nearly identical to that of the input signal of the PRE amplification apparatus 200 in which the distortion components do not exist.

Figure 7:
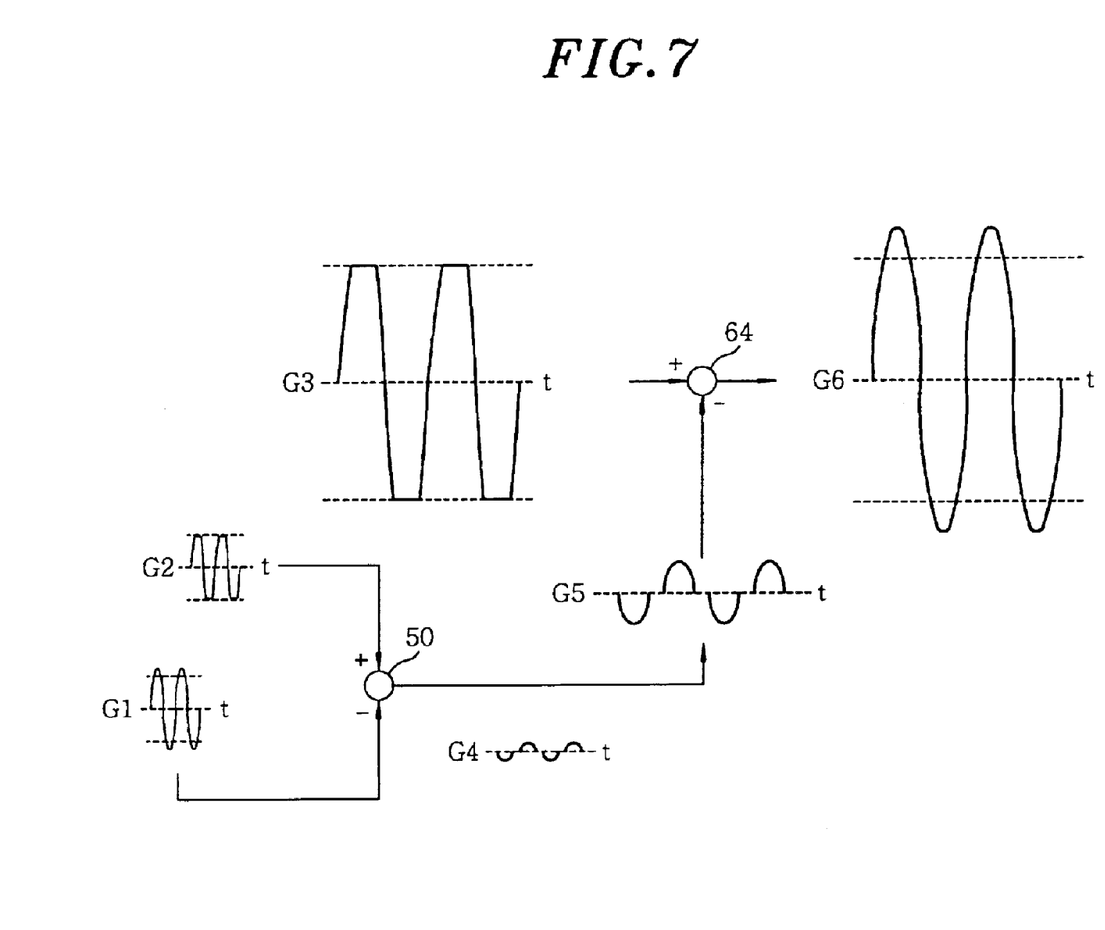
FIG. 7 presents graphs for illustrating output signal waveforms at various processing stages of the PRE amplification apparatus.

FIG. 7 presents graphs for illustrating signal characteristics plotted in time domain along two signal paths in the PRE amplification apparatus 200 in accordance with the present invention. In each graph, the x-axis represents time and the y-axis represents amplitude of the signal.

An output signal of the first delay line 48 is shown in graph G1. A clipped signal processed by the rate limiter 42 is shown in graph G2. The clipped signal, after passing through the power splitter 44 and the second delay line 52, is amplified by the amplification module 54. At this time, since the PAR of the clipped signal is reduced, the amplification module 54 outputs an almost linearly amplified signal, as shown in graph G3.

Meanwhile, an error signal corresponding to the peak power of the main channel signal truncated by the rate limiter 42 (i.e., the distortion components introduced by clipping the main channel signal in the rate limiter 42) is outputted from the combiner 50 and thereafter is amplified by the error amplifier 62. The error signal is represented in graph G4 and the amplified signal is represented in graph G5.

Finally, the amplified clipped signal and the amplified error signal are coupled at the directional coupler 64 so as to generate the output signal of the PRE amplification apparatus 200. The output signal is shown in graph G6, which clearly shows the linear amplification of the input signal.

While the invention has been shown and described with respect to the preferred embodiments, it will be understood by those skilled in the art that various changes and modifications may be made without departing from the spirit and scope of the invention as defined in the following claims.

What is claimed is:

1. A linearized amplification apparatus, comprising:
   means for dividing an input signal into a main channel signal and a subsidiary channel signal;
   a PAR (Peak-to-Average power Ratio) adjustment block for reducing a PAR of the main channel signal to generate a sub-main signal having a reduced PAR compared to the PAR of the main channel signal;
   an error extraction block for extracting an error signal from the subsidiary channel signal and amplifying the error signal, the amplified error signal corresponding to distortion components in the sub-main signal; and
   means for coupling the sub-main signal with the amplified error signal to generate an output signal having an increased PAR compared to the PAR of the sub-main signal,
   wherein the PAR adjustment block includes:
      means for clipping the main channel signal to a pre-determined range;
      means for subdividing the clipped signal into a primary signal and a secondary signal, and providing the secondary signal to the error extraction block;
   means for delaying the primary signal by a predetermined time; and
   an amplification module for pre-distorting and amplifying the delayed primary signal to output the sub-main signal.

2. The apparatus of claim 1, wherein the error extraction block includes:
   a first modulation unit for vector-modulating the subsidiary channel signal;
   means for delaying the vector-modulated subsidiary channel signal by a preset time;
   means for combining the delayed vector-modulated subsidiary channel signal and the secondary signal provided from the PAR adjustment block, to thereby extract the error signal, the error signal corresponding to a difference between the delayed vector-modulated subsidiary channel signal and the secondary signal;
   a second modulation unit for vector-modulating the extracted error signal; and
   an error amplification unit for amplifying the vector-modulated error signal to provide the amplified error signal.

3. The apparatus of claim 1, wherein the amplification module has a pre-distorter for pre-distorting the delayed primary signal and an amplifier for amplifying the pre-distorted primary signal, the pre-distorter introducing error components corresponding to distortions to be produced by the amplifier.

4. The apparatus of claim 3, wherein the PAR of the main channel signal, the PAR of the output signal and a PAR of the clipped signal have decreasing magnitudes in that order.

* * * * *